(12) United States Patent
Allen et al.

(10) Patent No.: US 7,694,926 B2
(45) Date of Patent: Apr. 13, 2010

(54) MOUNTING BRACKET

(75) Inventors: Joseph R. Allen, Tomball, TX (US); Thomas G. Bumby, Jr., Sugar Land, TX (US); Alan B. Doerr, Magnolia, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 186 days.

(21) Appl. No.: 11/776,252

(22) Filed: Jul. 11, 2007

(65) Prior Publication Data
US 2008/0053933 A1    Mar. 6, 2008

Related U.S. Application Data

(62) Division of application No. 10/866,035, filed on Jun. 14, 2004, now Pat. No. 7,281,694.

(51) Int. Cl.
A47G 29/02 (2006.01)
A47F 5/00 (2006.01)

(52) U.S. Cl. ............... 248/244; 248/221.11; 312/223.2; 312/265.1; 312/334.5; 211/26; 211/183

(58) Field of Classification Search ............ 248/221.11, 248/244, 222.11, 235; 211/26, 183; 312/223.2, 312/265.1, 334.5; 361/724, 727
See application file for complete search history.

(56) References Cited

U.S. PATENT DOCUMENTS

| | | | |
|---|---|---|---|
| 1,950,251 A | 3/1934 | Kulefsky | |
| 3,042,221 A | 7/1962 | Rasmussen | |
| 3,697,034 A | 10/1972 | Shell | |
| 4,444,323 A | 4/1984 | Travis | |
| 6,442,030 B1* | 8/2002 | Mammoser et al. | 361/727 |
| 6,578,939 B1* | 6/2003 | Mayer | 312/334.5 |
| 6,595,379 B1* | 7/2003 | Powell | 211/192 |
| 6,659,577 B2 | 12/2003 | Lauchner | |
| 6,702,124 B2* | 3/2004 | Lauchner et al. | 211/26 |
| 6,736,277 B2 | 5/2004 | Lauchner et al. | |
| 6,773,080 B2* | 8/2004 | Chen et al. | 312/265.1 |
| 6,830,300 B2 | 12/2004 | Lauchner | |
| 6,891,727 B2* | 5/2005 | Dittus et al. | 361/724 |
| 7,023,708 B2 | 4/2006 | Nguyen et al. | |
| 7,134,802 B2 | 11/2006 | Doerr et al. | |
| 7,357,362 B2* | 4/2008 | Yang et al. | 248/221.11 |
| 2001/0040203 A1* | 11/2001 | Brock et al. | 248/222.11 |
| 2002/0095963 A1 | 7/2002 | Doerr | |
| 2004/0120134 A1 | 6/2004 | Nguyen et al. | |

* cited by examiner

*Primary Examiner*—Amy J Sterling
*Assistant Examiner*—Tan Le

(57) ABSTRACT

An apparatus for mounting a rack-mount module having mounting brackets for mounting a horizontal support member between vertical support columns of an equipment rack. The mounting bracket comprises a base member and a latch. The base member comprises integrated side and end plates, with the side plate being securable to the horizontal support member and the end plate constructed to vertically support the mounting bracket thereon. The latch detachably adjoins the mounting bracket to the vertical support column, and is constructed to be hand-operated to detach the mounting bracket from the vertical support column in response to a tool-less manual manipulation of the latch.

28 Claims, 9 Drawing Sheets

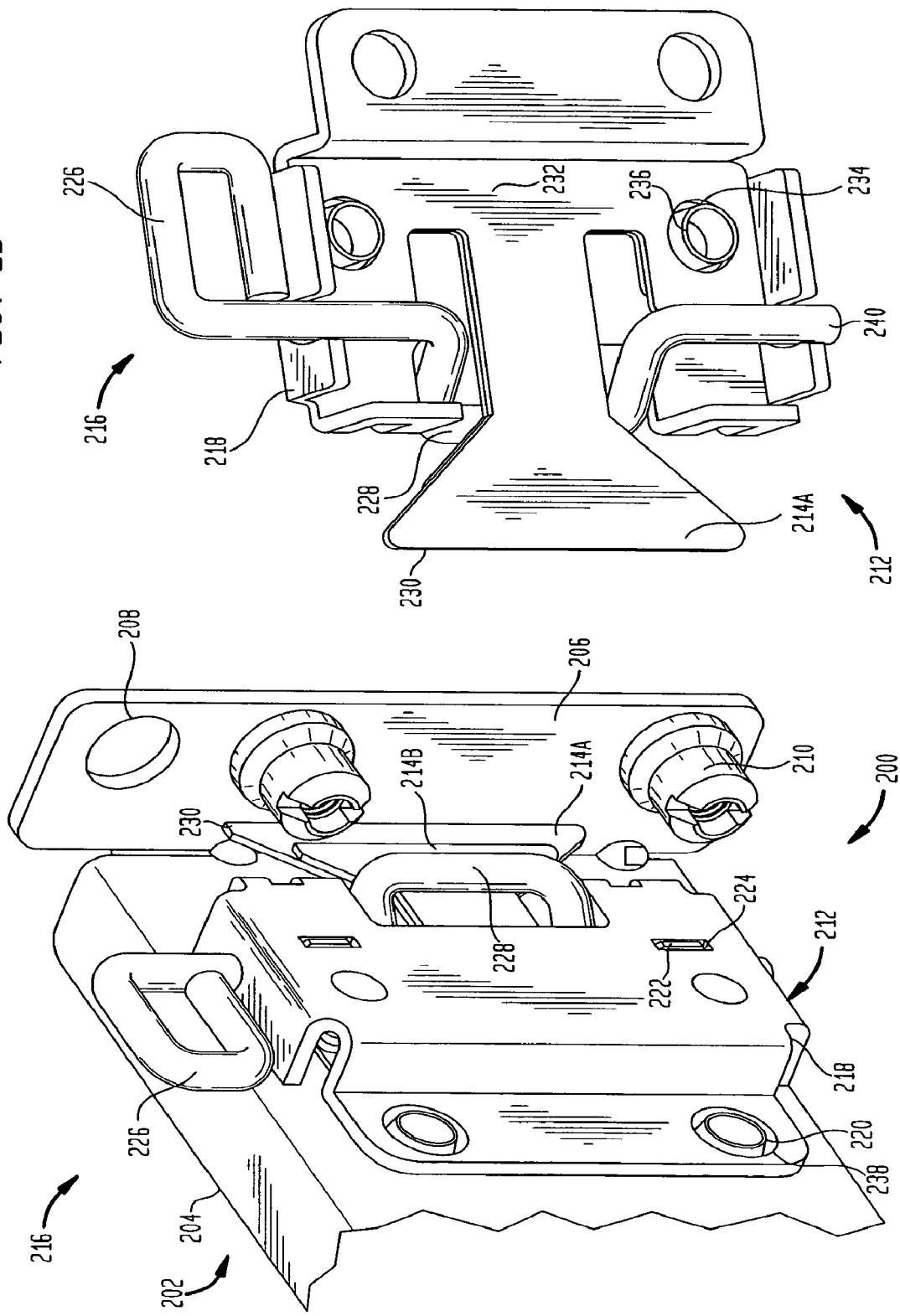

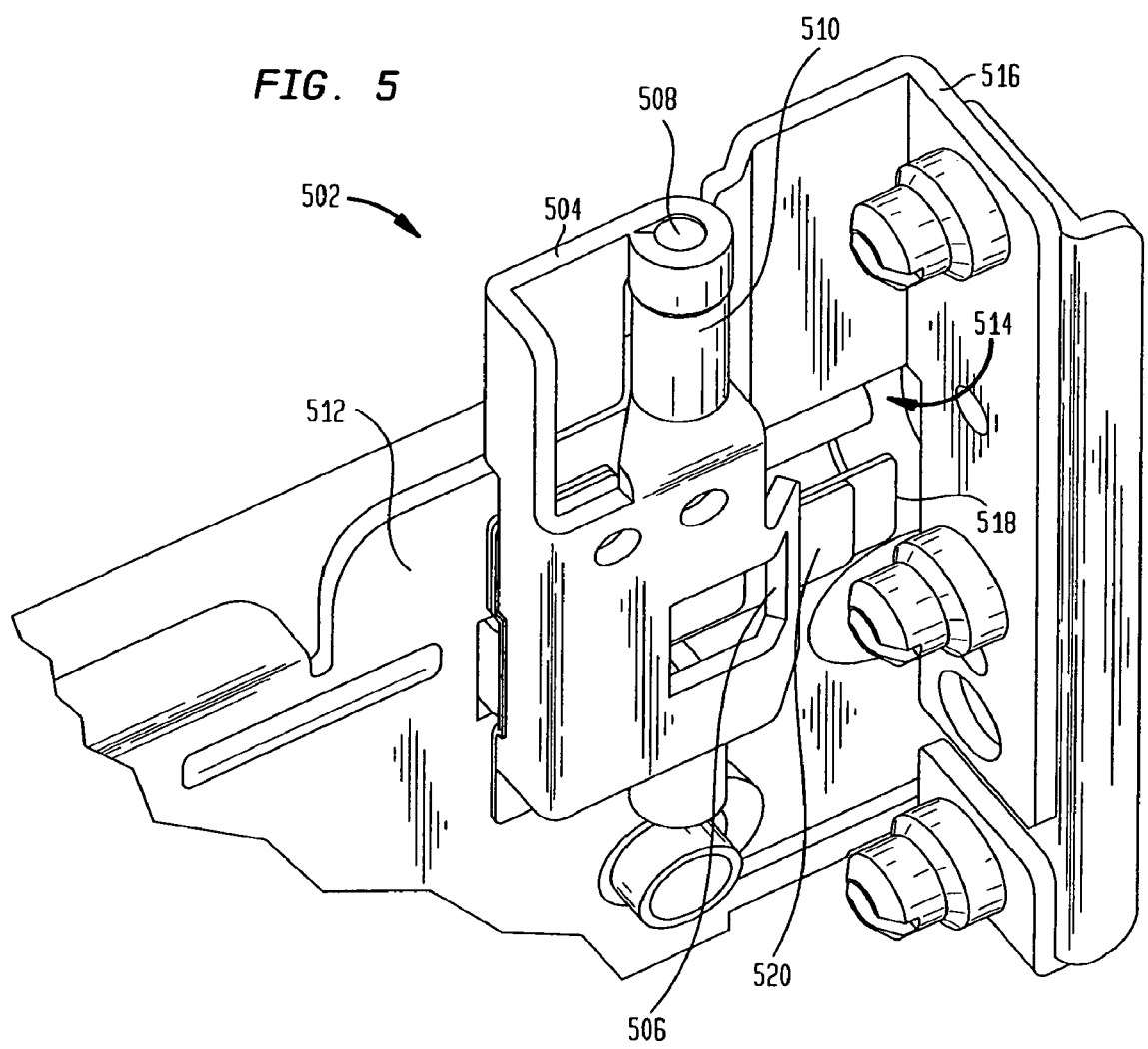

//MOUNTING BRACKET

CROSS-REFERENCE TO RELATED APPLICATIONS

This application is a divisional of U.S. patent application Ser. No. 10/866,035, filed date Jun. 14, 2004, now U.S. Pat. No. 7,281,694 all of which is hereby incorporated by reference herein. This application is related to commonly-owned U.S. Pat. No. 6,702,124 granted on Mar. 9, 2004, entitled "Flat Spring Clip for Tool-less Slide Installation," U.S. Pat. No. 6,659,577 granted on Dec. 9, 2003, entitled "Dual Flat Springs for Tool-less Slide Installation," and U.S. Pat. No. 6,830,300 granted on Dec. 14, 2004, entitled "Dual Flat Springs for Tool-less Slide Installation," all of which are hereby incorporated by reference herein in their entirety.

BACKGROUND

Computers such as servers and the like are enclosed within a housing or enclosure that provides multiple functions such as protecting operating components from damage and shielding the components from undesirable electromagnetic emissions. With the advent of data centers and the more recent trend toward collocation facilities, such electronics enclosures are often configured to be mounted in a standard-size cabinet commonly referred to as a server or equipment rack or cabinet ("equipment rack" herein). Typically, such an equipment rack houses multiple collocation computers and other electronics systems such as fan assemblies and wiring patch bays. These and other devices and systems configured to be mounted in an equipment rack are generally and collectively referred to herein as rack-mount modules.

Traditionally, equipment racks include a plurality of vertical support columns. Typically, there are four such columns defining the corners of a rectangular equipment rack. Rack-mount modules are commonly installed in equipment racks by directly or indirectly fastening the modules to these columns. Such arrangements commonly utilize a fixed-mount bracket, perhaps with a tray, fastened to the vertical support columns and to opposing sides of the installed module. When installed in this way, the module remains in a stationary position relative to the rack while the module is in operation. Access to such a module requires the module to be taken off-line, unfastened and physically separated from the rack, and placed on a floor, bench, table or other support surface. Such installations are suitable for many rack-mount modules.

However, a current trend has been to provide rack-mount modules that require periodic and/or rapid access. For example, some rack-mount servers contain hot-plug components (e.g., PCI cards) that can be replaced online. Such rack-mount modules are typically mounted on linear slide assemblies in the equipment rack so that the module can be serviced without interrupting real-time operations. As with the fixed-mount brackets, opposing linear slide assemblies are attached to the vertical support columns and to opposing sides of the module to, in the latter case, slidingly secure the module in the rack. Linear slide assemblies provide mechanical support for a rack-mount module along a continuum of interior and exterior positions relative to the rack.

The vertical support columns of an equipment rack include spaced holes, while the horizontal support members (e.g., the fixed-mount brackets and linear slide assemblies), include appropriately spaced pins configured to be inserted into the holes in the columns to position the horizontal support member on the vertical support columns. Various devices and techniques are known in the art to secure the horizontal support members to the columns. These known techniques are sometimes complicated, requiring tools to install and remove the horizontal support members from the rack. In addition, certain conventional racks and horizontal support members require the use of loose hardware which may be lost.

SUMMARY

Embodiments of the present invention are directed to a mounting bracket for mounting a horizontal support member between vertical support columns of an equipment rack. The mounting bracket comprises a base member and a latch. The base member comprises integrated side and end plates, with the side plate being securable to the horizontal support member and the end plate constructed to vertically support the mounting bracket on the vertical support column. The latch is constructed to releasably adjoin the mounting bracket to the vertical support column, and in response to a tool-less manual manipulation of the latch to release the mounting bracket from the vertical support column.

BRIEF DESCRIPTION OF THE DRAWINGS

FIG. 2A is a perspective view of one embodiment of a mounting bracket of the present invention.

FIG. 2B is another perspective view of the mounting bracket illustrated in FIG. 2A.

FIG. 5 is a perspective view of an alternative embodiment of the mounting bracket.

DETAILED DESCRIPTION

Figure 1:
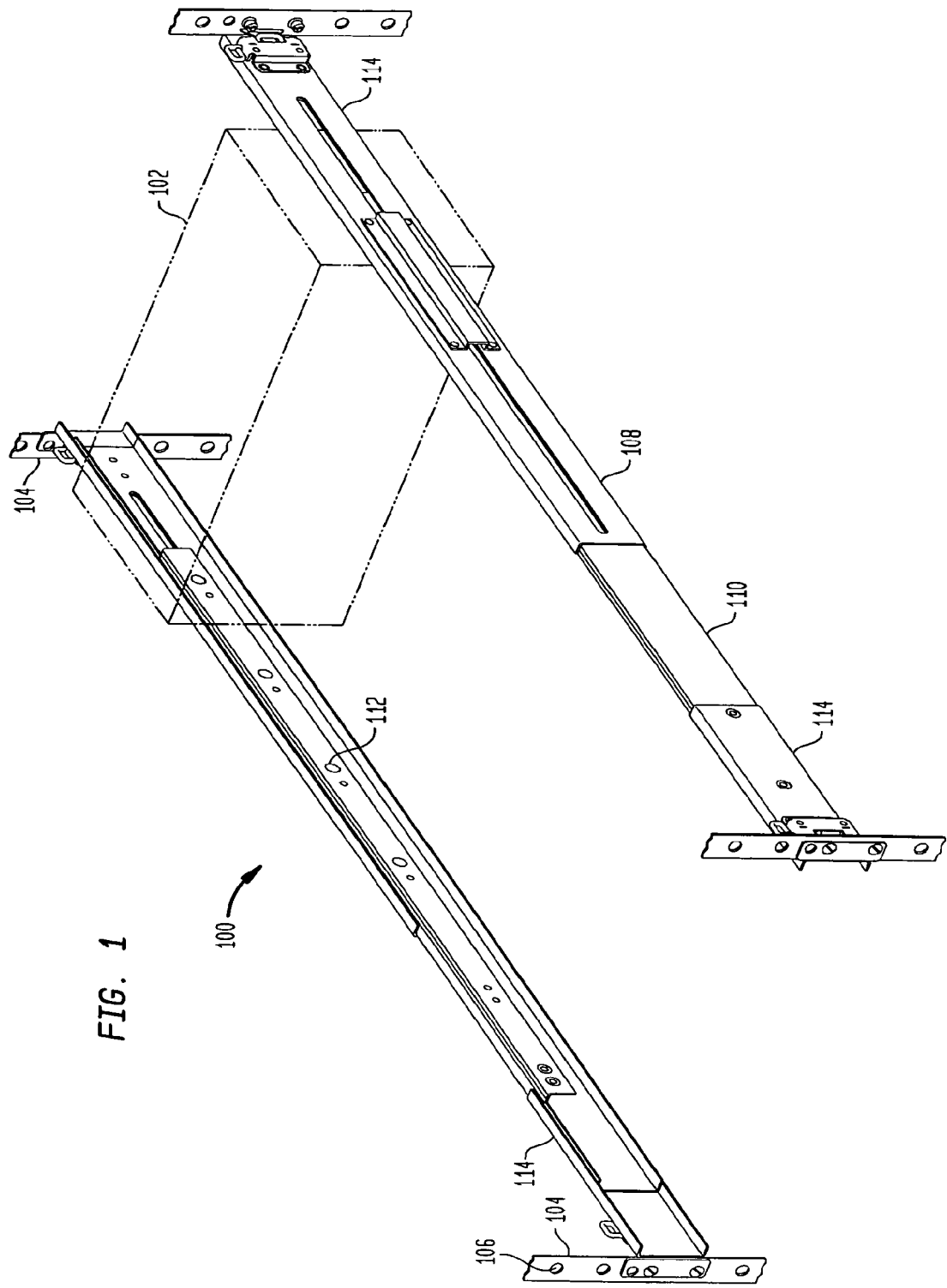
FIG. 1 is a partial perspective view of a relevant portion of an equipment rack with a rack-mount module mounted on a pair of linear slide assemblies utilizing one embodiment of the mounting bracket of the present invention.

FIG. 1 is a partial perspective view of a four-post equipment rack 100 in which a rack-mount module 102 is installed in accordance with the teachings of the present invention. Equipment racks such as standard server racks commonly used in computer rooms, collocation facilities and other data centers (collectively, "data centers") are configured to operationally secure electronics equipment housed in rack-mount enclosures. The electronics systems are generally computers and, in particular, servers, server blade systems, as well as other equipment such as fan assemblies and wiring patch bays, among others. In the following description, systems configured to be installed in an equipment rack such as equipment rack 100 are generally and collectively referred to herein as rack-mount modules 102.

Equipment rack 100 includes four vertical support columns 104. Equipment rack 100 can be any standard or non-standard equipment rack now or later developed. Standard equipment racks generally are compliant with industry-accepted standards which dictate their dimensions, physical strength, etc., while non-standard equipment racks may be compliant with a portion or none of such industry standards. Regardless, equipment rack 100 is suitable for having the noted rack-mount modules 102, which also may or may not be compliant with industry-standard dimensions, installed therein. Each vertical support column 104 has a plurality of spaced holes 106 to which horizontal support members 108 are mounted.

Rack-mount modules 102 can be installed in equipment rack 100 using any of a variety of horizontal support members 108. In the embodiment shown in FIG. 1, for example, horizontal support members 108 are linear slide assemblies. It should be appreciated, however, that rack-mount module 102 can be installed in equipment rack 100 using other horizontal support members such as fixed-mount brackets. Such stationary brackets may include a tray to further support an installed rack-mount module 102. In the following description, reference will be made to linear slide assembly or assemblies 108. It should be appreciated that unless noted otherwise, such reference also applies to any horizontal support member now or later developed.

Linear slide assemblies 108 provide mechanical support for module 102 along a continuum of positions relative to equipment rack 100. Traditionally, to support a rack-mount module 102, two linear slide assemblies 108 are rigidly secured to opposing sides of the module and are interposed between the module and equipment rack 100. (Typically, the linear slide assemblies are located on the left and right sides of the module from the perspective of a person facing the front of equipment rack 100. This left and right reference will be used throughout this application.)

Each linear slide assembly 108 traditionally includes a stationary slide rail 110 secured directly or indirectly to equipment rack 100, and at least one movable slide rail 112. One of the movable slide rails 112 is secured to the left or right side of rack-mount module 102. To gain access to module 102, a user slides the module out of equipment rack 100 on linear slide assemblies 108. That is, the user repositions module 102 from an interior position in equipment rack 100 to a desired exterior position at least partially outside the rack. It should be appreciated that linear slide assemblies 108 can use any combination of mechanisms that permit a relative longitudinal displacement among their component slide rails. For example, linear slide assemblies 108 can include ball bearings, friction slides, and/or other mechanisms now or later developed. Preferably, such mechanisms are selected to enable rack-mount module 102 to free-float on the linear slide assemblies so that minimal force is required to reposition the module.

In accordance with certain embodiments of the present invention, mounting brackets 114 are provided to mount horizontal support members 108 to vertical support columns 104. Particular embodiments of mounting brackets 114 are configured to facilitate the tool-less detachment of horizontal support member 108 from equipment rack 100. As will be described in detail below, such embodiments of mounting bracket 114 do not require tools to be securely mounted to equipment rack 100, nor are tools required to detach the mounting bracket from the equipment rack. Rather, such mounting brackets 114 are hand-operated; that is, tool-less manual manipulation is all that is required to unlatch the mounting bracket from the equipment rack. These operations can be performed rapidly from, for example, inside the equipment rack. This is described in greater detail below.

In the embodiment shown in FIG. 1, mounting bracket 114 is connected proximate to each end or end region of linear slide assembly 108. Mounting bracket 114 is permanently or removably attached to horizontal support member 108. Preferably, mounting brackets 114 are adjustable relative to each other to enable horizontal support member 108 to be mounted on equipment racks of various dimensions. Accordingly, in certain embodiments, mounting brackets 114 are slidingly connected to each other. In an alternative embodiment, one or both mounting brackets 114 are slidingly connected to opposing ends of the implemented horizontal support member 108. This latter embodiment is illustrated in FIG. 1. There, one mounting bracket 114 is secured to linear slide assembly 108 via screws while the other mounting bracket 114 is slidingly attached to the linear slide assembly 108.

The construction and operation of one embodiment of mounting bracket 114 is provided next below with references to FIGS. 2A and 2B. FIGS. 2A and 2B are perspective views of opposing sides of one embodiment of a mounting bracket 114 of the present invention, referred to herein as mounting bracket 200. Mounting bracket 200 comprises a base member 202 fixedly or slidingly attached to horizontal support member 108, and removably mounted to a vertical support column 104 to mount the horizontal support member to the vertical support column. Latch 212 is secured to an interior surface of base member 202, as shown in FIG. 2A and described below.

Base member 202 comprises a side plate 204 (partially shown in FIG. 2A) securable to horizontal support member 108 (not shown). Mounting bracket 200 further comprises an end plate 206 integral with side plate 204 and constructed to releasably attach mounting bracket 200 to vertical support column 104 (FIG. 1). In the embodiment shown in FIG. 2A, end plate 206 comprises at least one pin 210 extending therefrom to be received by, or engage, a selected hole 106 in a vertical support column 104. When mounting bracket 200 is installed in an equipment rack 100, pins 210 are passed through holes 106 to vertically support horizontal support member 108 on vertical support column 104. Preferably, at least two pins 210 are provided on end plate 206 to prevent mounting bracket 200 from pivoting about an axis defined by one pin 210.

End plate 206 has formed therein at least one hole 208 each alignable with a hole 106 in vertical support column 104. In embodiments in which end plate 206 comprises more than one hole 208, such holes are appropriately spaced to enable at least a subset of the holes to properly align with vertical support column holes 106. As one of ordinary skill in the art would appreciate, mounting bracket 200 can be configured to be installed on a variety of equipment racks 100 having vertical support columns 104 with holes 106 that are spaced from each other by various distances. Accordingly, in certain embodiments, holes 208 in end plate 206 are arranged such that one combination of holes 208 align with holes 106 of one rack while a different combination of holes 208 align with holes 106 of a different rack. In FIG. 2A, for example, holes 208 are not evenly spaced on end plate 206. As such, holes 208A and 208B may align with holes 106 of one rack 100 while holes 208A and 208C align with holes 106 of a different rack 100. It should also be appreciated that more than two holes 208 and pins 210 may be utilized to attach mounting bracket 200 to vertical support column 104 depending on the weight and mass of rack-mount module 102, the length of linear slide assemblies 108, and, perhaps, other factors. It should be appreciated that pins 210 may, in alternative embodiments, be permanently attached to, or part of, end plate 206.

In embodiments in which side plate 204 has a length, the side plate will often have a longitudinal axis that is substantially parallel with a longitudinal axis of linear side assembly 108 to which it is attached. As will be described in more detail below and as shown in FIG. 2A, end plate 206 is substantially parallel with the flange of vertical support column 104 to which it is adjoined. As such, end plate 206 and side plate 204 are substantially orthogonal with each other in many embodiments. For example, in the embodiment of base member 202 shown in FIG. 2A, base member 202 is generally L-shaped. It should be appreciated, however, that this configuration of base member 202 need not be implemented in all embodiments and that the relative orientation of end plate 206 and side plate 204 is a function of the dimensions of equipment rack 100 in which it is to be installed and the orientation of the horizontal support members 108 relative to vertical support columns 104. It should also be appreciated that, as shown in FIG. 2A, base plate 202 and side plate 204 can be separately manufactured elements that are permanently secured to each other by, for example, welds. Alternatively, base member 202 can have a unibody construction.

Figure 3:
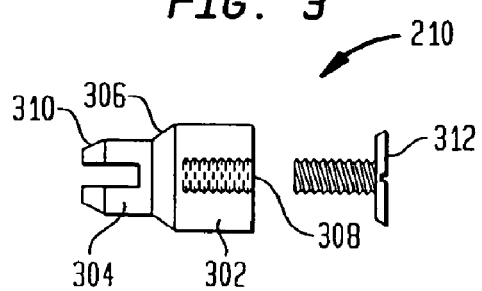
FIG. 3 is a side view of one embodiment of the pin illustrated in FIG. 2A.

FIG. 3 is a side view of one embodiment of a pin 210. In this embodiment, pins 210 are configured to be positioned in at least two holes 104 of different dimensions. The embodiment of pin 210 shown in FIG. 3 has a dual diameter configuration to interoperate with holes 104 of two diameters. Pin 210 has a base 302 with a diameter sufficient to enable the base to fit within a larger-diameter hole 104. Pin 210 also has a shaft 304 integral with base 302 that has a diameter that is less than the diameter of base 302, which enables shaft 304 to fit within a smaller-diameter hole 104. A shoulder 306 is formed in pin 210 to transition from the larger-diameter base 302 to the smaller-diameter shaft 304. When a mounting bracket 200 is installed in a rack having holes 104 dimensioned to receive base 302, end plate 206 adjoins vertical support column 104 by physically contacting the column. However, when mounting bracket 200 is installed in a rack having holes 104 dimensioned to receive shaft 304 and not base 302, end plate 206 adjoins vertical support column 104 by contacting shoulder 406. In other words, end plate 206 is secured to, yet spaced slightly away from column 104 by the height of base 302. As used herein, the term "adjoin" encompasses both such circumstances; that is, when end plate 206 directly contacts vertical support column 104 as well as when the end plate indirectly contacts the vertical support member due to the intervening portion of pin(s) 210.

Pin 210 has a threaded opening 308 in base 302, and mounting bracket 200 comprises screws 312 each extending through a hole 208 in end plate 206 to threadingly engage the threaded opening of the pin. In such an embodiment, pin 210 is removably secured to end plate 206. This embodiment permits the user to select the number of pins 210 that would be necessary or desired to support the particular rack-mount module 102, as well as to select the relative spacing of the pins to accommodate the spacing of holes 106.

Preferably, hole 208 is beveled and screws 312 has a corresponding shape such that screw 312 is countersunk in end plate 206 when assembled. In one embodiment, shaft 304 has a slotted tip 310 to facilitate manual threading of pin 210 and screw 312. It should be appreciated by those of ordinary skill in the art that pins 210 can be permanently or removably secured to end plate 206 using a variety of alternative approaches now or later developed.

Returning to FIGS. 2A and 2B, latch 212 is described next below. Latch 212 is secured to base member 202 and is constructed and arranged to securely and releasably mount mounting bracket 114 to vertical support column 104. Importantly, latch 212 is constructed to be hand-operated to release mounting bracket 200 from vertical support column 104; that is, in response to a tool-less manual manipulation of latch 212. The flange of each vertical support column 104 that receives mounting bracket 200 is substantially planar, having a surface that abuts end plate 206 and an opposing surface. Latch 212 comprises an adjustable abutment member 214 that is adjustable to at least two positions. In a latched position, abutment member 214 abuts the opposing surface of support column 104 to securely mount mounting bracket 200 to vertical support column 104. In an unlatched position, abutment member 214 is offset from vertical support column 104 and does not restrict movement of mounting bracket 200 relative to vertical support column 104. Thus, in the unlatched position, mounting bracket 200 is vertically supported on pins 210, and is releasably mounted on vertical support column 104.

In one embodiment, adjustable abutment member 214 is a cantilevered flat spring and, in the particular embodiment shown in FIGS. 2A and 2B, the abutment member comprises two cantilevered flat springs 214A and 214B. As noted above in connection with pins 210, this embodiment of mounting bracket 200 is capable of being installed in various equipment racks 100 having holes 106 of at least two different dimensions. When mounting bracket 200 is installed on a vertical support column 104 having holes 106 that receive base member 302 of pins 210, longer flat spring 214A operates to securely adjoin the vertical support column to end plate 206. Alternatively, when mounting bracket 200 is installed on a vertical support column 104 having holes 106 that receive shaft 304 and not base 302 of pins 210, shorter flat spring 214B operates to securely adjoin the vertical support column to end plate 206 (slightly spaced apart by the height of base 302). To insure flat springs 214 are installed in the proper sequence, fixed end 232 of flat spring 214B has one or more tabs 222 that are aligned with and extend into corresponding apertures 224 in latch cover 218.

Referring to FIG. 2B, flat springs 214 have a stationary end 232 securely coupled to base plate 204, and an adjustable free end 230 adjacent to and spaced apart from end plate 206. Stationary ends 232 of flat springs 214 each have an aperture 234 through which extrusions 236 of latch cover 218 extend. The ends of extrusions 236 are designed to be bent radially outward, or flared, to secure flat springs 214 to latch cover 218. Similarly, latch cover 218 has apertures 238 that receive extrusions 220 in side plate 204. Although not shown in FIG. 2A, extrusions 220 are also ultimately bent to rigidly secure latch cover 218 to side plate 204. It should be appreciated by those of ordinary skill in the art that adjustable flat springs 214 can be secured to base member 204, and latch cover 218 can be secured to side plate 204, using any other securing means now or later developed. For example, in alternative embodiments, screws, stakes, welds and/or nuts and bolts can be used.

As noted, flat springs 214 each have a free end 230 that securely retains mounting bracket 200 on vertical support column 104. In one embodiment, free end 230 is flared to avoid damaging the vertical support column 104, particularly when rack-mount module 102 is rapidly repositioned to its full, forward-stopped position exterior of equipment rack 100. It should be appreciated, however, that free end 230 need not be flared and that the dimensions and configuration of flat spring 214 can be altered to suit a particular application. For example, in an alternative embodiment, free end 230 of each flat spring 214 is forked with a plurality of arms configured to simultaneously abut an installed vertical support column 104. In a further embodiment, the forward edge of each free end 230 is coated with a resilient material such as rubber.

As one of ordinary skill in the art would appreciate, adjustable abutment member 214 can take on other forms in alternative embodiments. For example, rather than cantilevered flat springs as shown FIGS. 2A and 2B, adjustable abutment member 214 can be implemented as flexible members having other configurations. More broadly, adjustable abutment member 214 can be implemented with any adjustable mechanism that can assume at least one latched position to securely adjoin, and one and unlatched to releasably adjoin, end plate 206 with vertical support column 104. Such alternative abutment members may, for example, slide, rotate, translate, or otherwise move from a latched to an unlatched position in response to tool-less manual manipulation of the latch. The manner in which the illustrative embodiment of adjustable abutment members 214 securely and releasable adjoins end plate 206 to vertical support column 104 is described next below.

Latch 212 further comprises a hand-operated action mechanism 216 operationally coupled to base member 202 and abutment member 214. Tool-less hand manipulation of action mechanism 216 causes abutment member 214 to transition from a latched to unlatched position. As noted, when adjustable abutment member 214 is in the unlatched position, end plate 206 releasably adjoins vertical support column 104. In the embodiment shown in FIGS. 2A and 2B, action mechanism 216 is implemented in the form of a lever rotatably connected to base member 202. This embodiment of lever 216 has an operational portion 228 adjacent to flat springs 214, and a hand-operated portion 226 accessible from the interior of equipment rack 100. Lever 216 is shaped to define an integrated fulcrum or pivot 240 about which operational portions 228 and hand-operated portion 226 rotate. Tool-less rotation of hand-operated end 226 about its vertical axis defined by fulcrum 240 causes operational end 228 to apply a force to flat springs 214 to bias free end 230 of flat springs 214 toward side plate 204. This causes flat springs 214 to translate or be displaced from a latched position abutting the adjoining vertical support member, to an unlatched position in which edges 230 of flat springs 214 are offset from and not in contact with or otherwise restricting movement of the vertical support member.

Figure 4D:
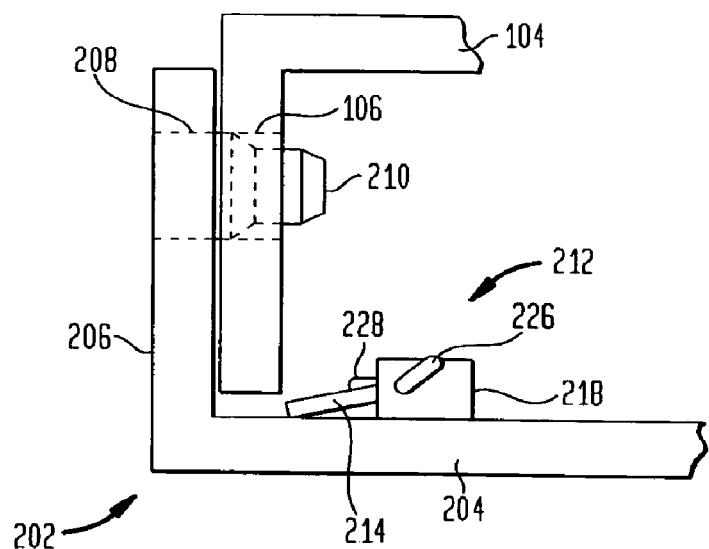
FIGS. 4A-4E are schematic diagrams illustrating the operation of one embodiment of the present invention.
Figure 4E:
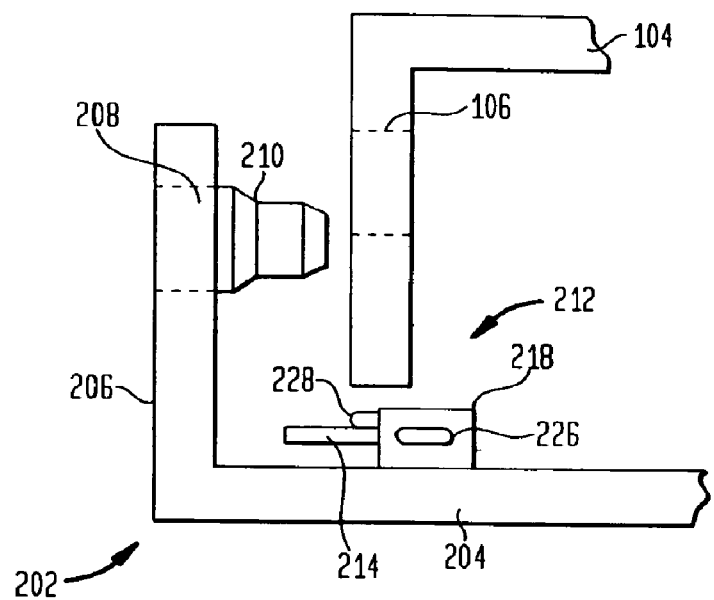
Figure 4A:
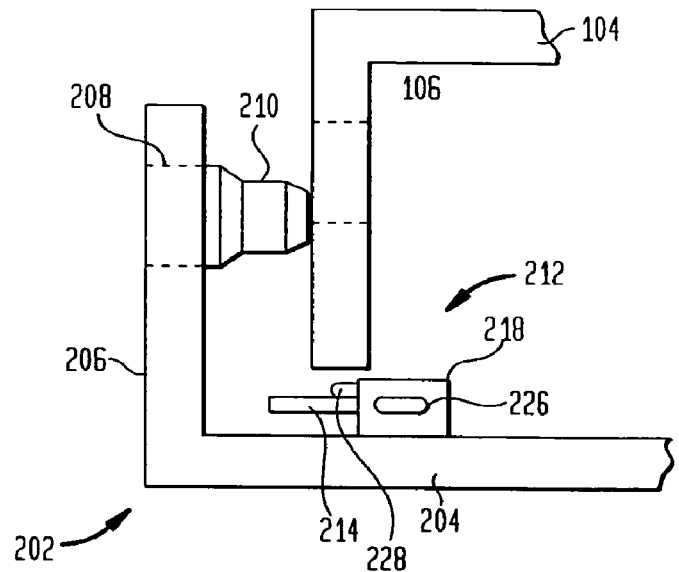
Figure 4B:
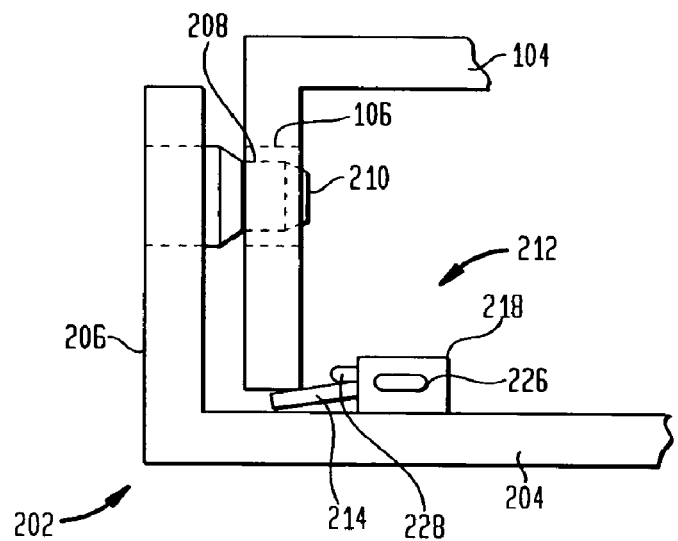
Figure 4C:
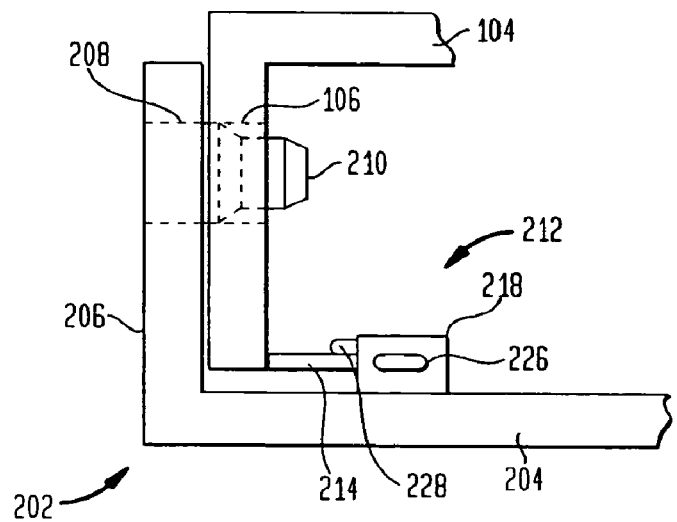
Figure 6:
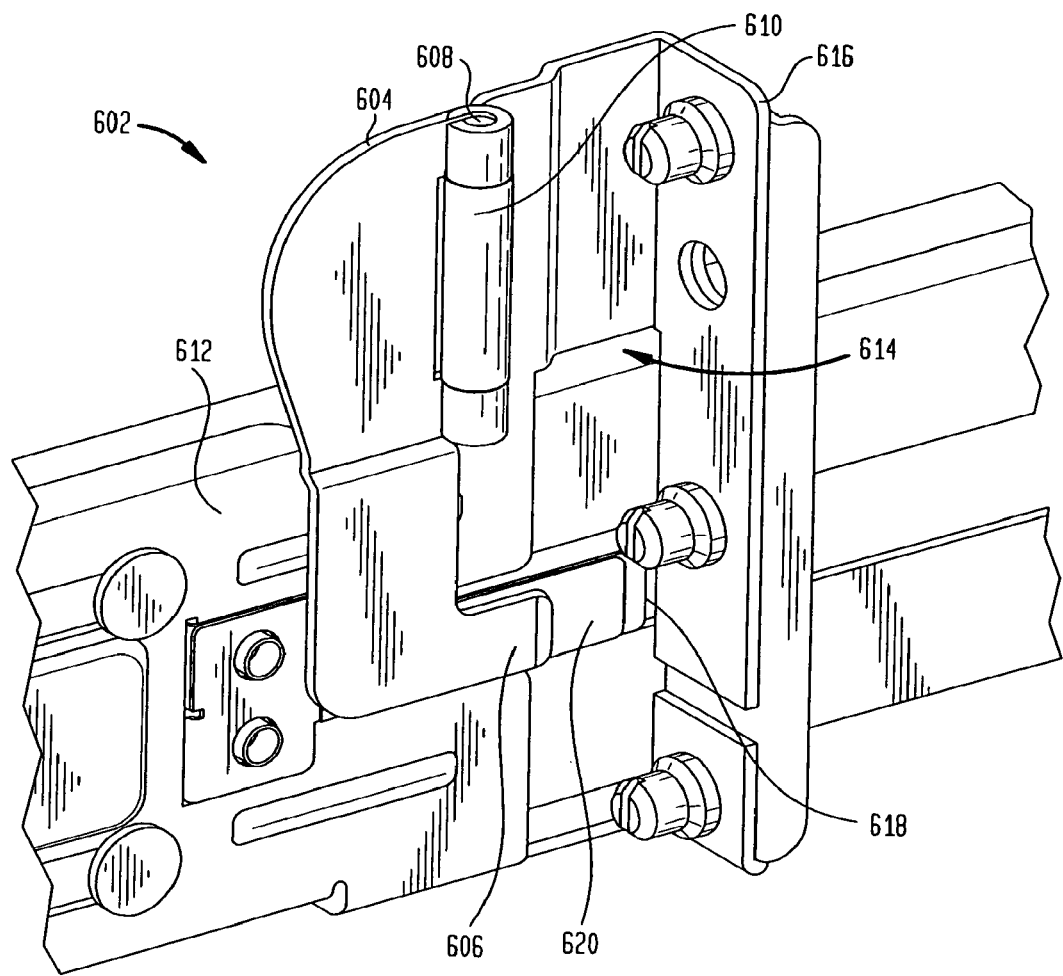
FIG. 6 is a perspective view of an alternative embodiment of the mounting bracket.
Figure 7:
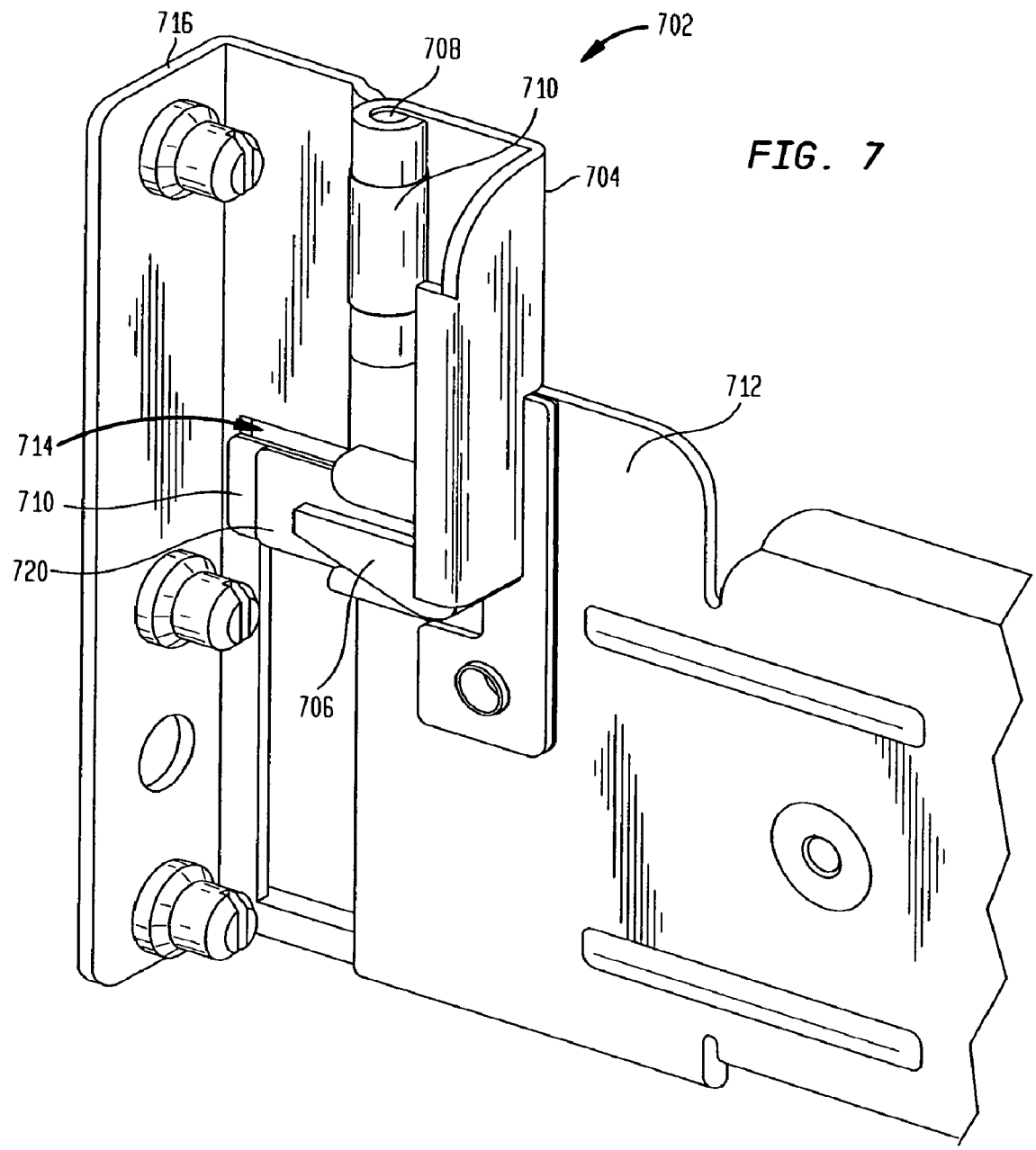
FIG. 7 is a perspective view of an alternative embodiment of the mounting bracket.
Figure 8:
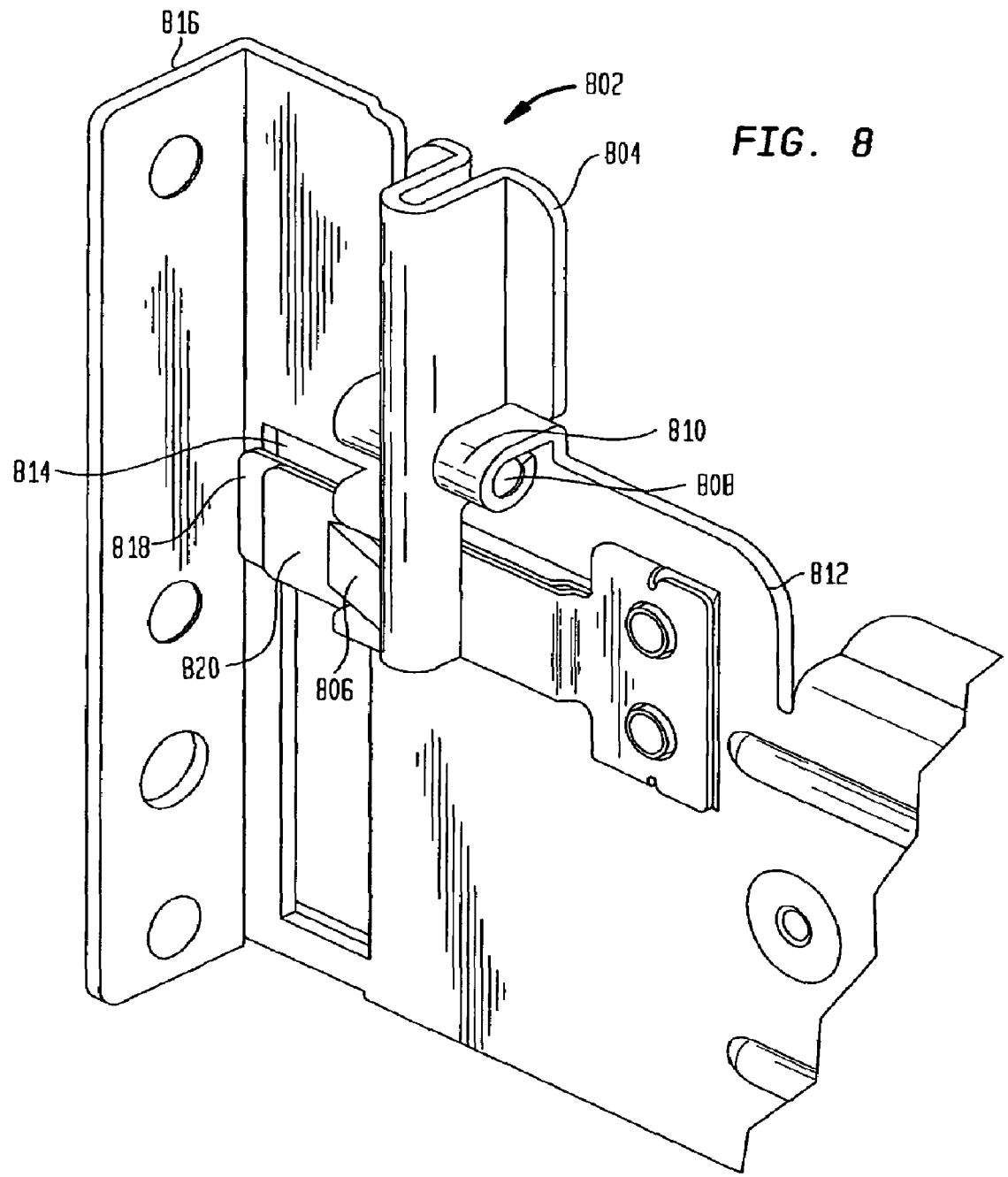
FIG. 8 is a perspective view of an alternative embodiment of the mounting bracket.

FIGS. 4A-4E are schematic diagrams illustrating the operation of one embodiment of the present invention. In this exemplary embodiment, a single flat spring 214 is shown for ease of illustration. FIGS. 4A-4C show three successive states of mounting bracket 200 as it is mounted on a vertical support column 104. In FIG. 4A, mounting bracket 200 is spaced apart from vertical support column 104. In FIG. 4B, the end of vertical support column 104 biases flat spring 214 toward side plate 204 as pin 210 is brought into alignment with hole 106 in vertical support column 104. In FIG. 4C, pin 210 is fully inserted into hole 106 in vertical support column 104, and mounting bracket 200 is adjoined to vertical support column 104. As shown in FIG. 4C, the end of vertical support column 104 extends past the edge of flat spring 214, allowing the flat spring to return to its unbiased position. In the unbiased position shown in FIG. 4C, flat spring 214 abuts vertical support column 104, securely adjoining mounting bracket 200 to vertical support column 104. Through the operations depicted in FIGS. 4A-4C, operational portion 228 and hand-operated portion 226 of action mechanism 216 remain generally in the unlatched position since hand-operation of action mechanism 216 is not required to cause latch 212 to attain its latched position. Rather, in this embodiment, latch 212 automatically latches in response to the installation of mounting bracket 200 on vertical support column 104, as shown.

FIGS. 4C through 4E show three successive states of mounting bracket 200 as it is detached from vertical support column 104. FIG. 4C, as noted, shows mounting bracket 200 mounted to vertical support column 104 with end plate 206 securely adjoined to the vertical support column.

In FIG. 4D, tool-less rotation of hand-operated portion 226 causes operational portion 228 to bias flat spring 214 toward side plate 204. In this unlatched state, end plate 206 of mounting bracket 200 is releasably adjoined to vertical support column 104. In FIG. 4E, mounting bracket 200 is detached from vertical support column 104 by translating mounting bracket 200 to remove pin 210 from hole 106 in vertical support column 104.

FIGS. 5 through 8 are each a perspective view of alternative embodiments the latch of the present invention. It should be appreciated that alternative embodiments of the action mechanism can be implemented to provide tool-less unlatching of the implemented adjustable abutment member. For example, in FIGS. 5, 6, 7 and 8 the action mechanism is implemented as levers 502, 602, 702, 802 in the form of a plate having a hand-operated portion 504, 604, 704, 804, respectively, and an operational portion 506, 606, 706, 806 respectively. Lever 502, 602, 702, 802 pivots about an axis defined by a pintle or pin 508, 608, 708, 808 retained in a lumen 510, 610, 710, 810 formed in a side plate 512, 612, 712, 812. In the embodiments shown in FIGS. 5, 6 and 7, the axis defined by pins 508, 608, 708 are substantially vertical axes (when installed) while in the embodiment shown in FIG. 8 the axis defined by pin 808 is a substantially horizontal axis (when installed).

Side plate 512, 612, 712, 812 has an opening 514, 614, 714, 814 adjacent to end plate 516, 616, 716, 816 located and dimensioned to allow free ends 518, 618, 718, 818 of flat springs 520, 620, 720, 820 to be biased past side plate 512, 612, 712, 812. In the embodiments of FIGS. 5, 6, 7 and 8, flat springs 520, 620, 720, 820 are translated from latched to unlatched positions in response to a force applied by operational portion 506, 606, 706, 806. In such embodiments, cantilevered flat springs 520, 620, 720, 820 have a substantially consistent cross-section; that is, they are not flared.

Figure 9:
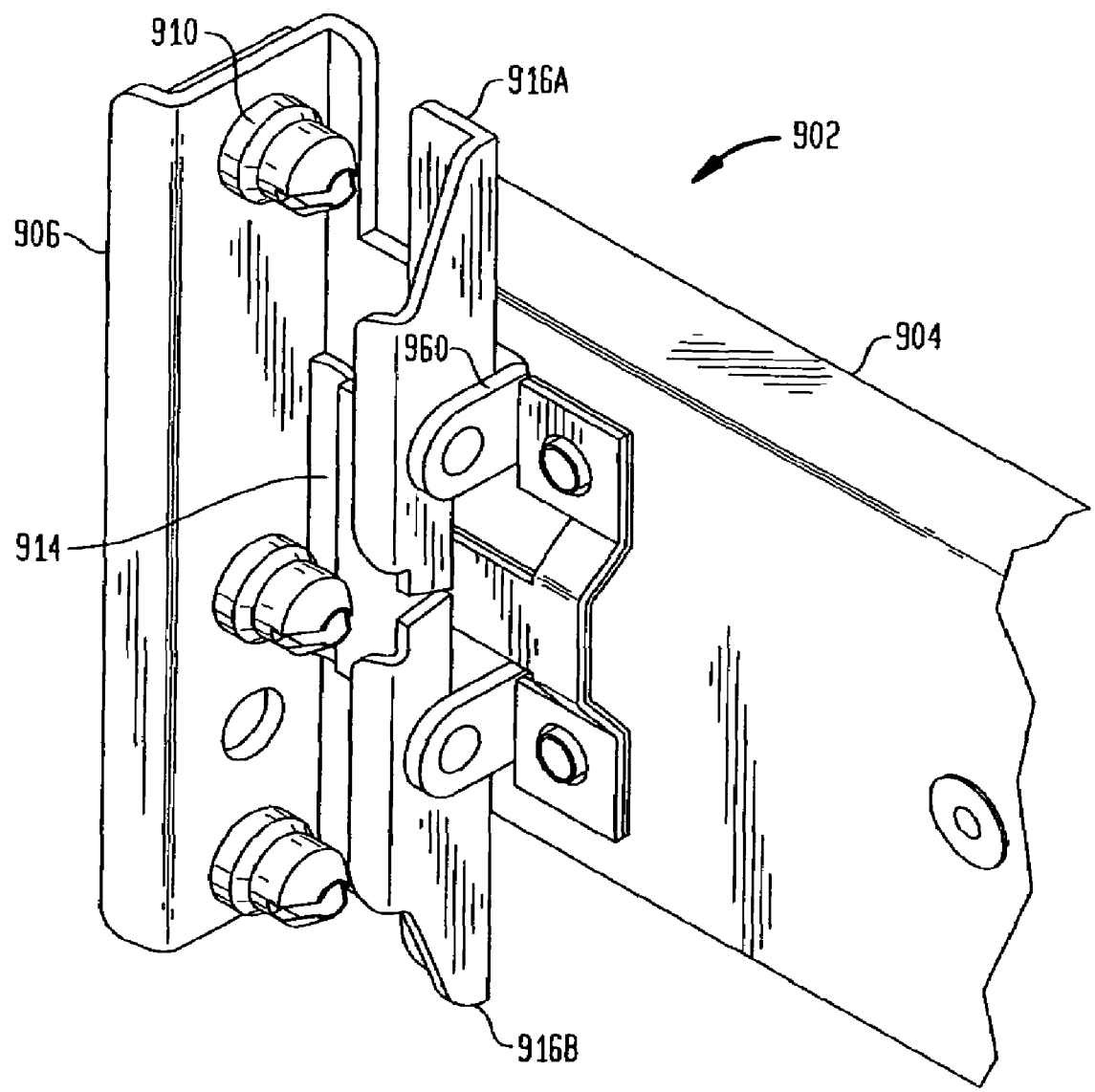
FIG. 9 is a perspective view of an alternative embodiment of a mounting bracket of the present invention.

FIG. 9 is a perspective view of an alternative embodiment of a mounting bracket of the present invention. In this embodiment, mounting bracket 902 comprises an end plate 906 and a side plate 904. Flat springs 914 are controlled by two action mechanisms 916A and 916B. In this illustrative embodiment, action mechanisms 916 are hinged levers as described above. Here, side plate 904 has flanges 960 each providing a horizontal axis about which an associated lever 916 rotates.

One lever 916A extends beyond a top edge of base member 904 (when oriented in its installed position) while the other lever 916B extends beyond the bottom edge of base member 904 (also when oriented in its installed position). As such, a user can access the lever arms 916 from either the top or bottom of side plate 904, and rotate a selected lever arm 916 to displace flat springs 914 into the unlatched position.

The embodiment of the mounting bracket 902 shown in FIG. 9 permits ambidextrous operation. That is, the same mounting bracket 902 can be mounted on opposing ends of a horizontal support member 108, and on horizontal mounting brackets 108 secured to the left and right sides of rack-mount module 102. Then, the same tool-less manipulation by an operator's left and right hands on the left- and right-side mounting brackets, respectively, will unlatch the associated left- and right horizontal support member 108. Thus, in addition to costing less to manufacture and inventory as compared with left and right versions of the mounting bracket, horizontal support members 108 having mounting brackets 902 mounted thereon can be installed on either side of an equipment rack 100, and can be installed without concern for which end is located in the front or rear of the rack.

Although the present invention has been fully described in conjunction with embodiments thereof with reference to the accompanying drawings, it is to be understood that various changes and modifications may be apparent to those skilled in the art. For example, in the embodiments described above, latch 212 automatically latches. It should be appreciated, however, that in alternative embodiments, latch 212 may include an adjustable abutment member that latches to securely adjoin mounting bracket 200 to vertical support column 104 in response to a hand-operated action. In other words, latch 212 can be hand-operated to both latch and unlatch a mounting bracket 200 to a vertical support column 104. As another example, it should also be appreciated that alternative embodiments of activation mechanism 216 may be implemented to control adjustable abutment member 214 to unlatch, or latch, mounting bracket 200 to vertical support column 104. Such activation mechanisms may directly or indirectly control the implemented adjustable abutment member. Such activation mechanisms may include, for example, slides, cables, gears, etc., and may utilize a force generated from other than the manual force applied to the implemented activation mechanism 214. For example, in alternative embodiments solenoids are used. As a further example, it should further be appreciated that abutment member 214 may transition between the latched and unlatched positions via a translation or displacement. Alternative embodiments in which the abutment member 214 rotates between the latched and unlatched positions are also contemplated. Such changes and modifications are to be understood as included within the scope of the present invention as defined by the appended claims, unless they depart therefrom.

It should be appreciated that embodiments of the present invention provides advantages over prior approaches including those described in commonly-owned U.S. Pat. No. 6,702,124, entitled "Flat Spring Clip for Tool-less Slide Installation," U.S. Pat. No. 6,659,577, entitled "Dual Flat Springs for Tool-less Slide Installation," and U.S. Pat. No. 6,830,300, entitled "Dual Flat Springs for Tool-less Slide Installation."

As noted, embodiments of the present invention can be unlatched without tools; that is, it is, as noted, a latch that permits tool-less unlatching. This allows for easy removal of the horizontal support members 108 from equipment rack 100. Furthermore, once easily removed, the horizontal support members can be quickly repositioned and mounted at another location on the vertical support columns. This is attained by embodiments which provide for automatic latching of the mounting bracket and vertical support column, as well as those embodiments that latch in response to a hand-operated action since such an action can be similar to, or the converse of, the had-operated action utilized to latch the mounting bracket. It should further be appreciated that embodiments of the present invention provide adjustable abutment members 214 having a free end with a flared or other configuration which, as noted, prevent such members from damaging vertical support columns 104. Another advantage provided by certain embodiments of the present invention is that the side plates are slidingly adjustable relative to each other either directly or indirectly through the implemented horizontal support members. This enables such embodiments to be adjusted so that the distance between the mounting brackets disposed on the horizontal support member can be mounted on vertical columns that are separated by different distances. This facilitates the manufacturing of a single model of the mounting brackets and/or horizontal support members to accommodate a variety of equipment racks of varying dimensions. Importantly, such embodiments can attain such advantages without having to add, remove or replace parts, clips, fasteners, etc, and without the use of tools.

What is claimed is:

1. An apparatus for mounting a rack-mount module, comprising:
    at least one horizontal support member configured to be secured to a side of the rack-mount module; and
    a pair of mounting brackets each connected to an opposite end region of the horizontal support member to mount the horizontal support member between two vertical support columns of an equipment rack, each mounting bracket comprising:
        a base member comprising a side plate securable to the horizontal support member, and an end plate integral with the side plate and comprising at least one pin extending therefrom to vertically support the horizontal support member on the vertical support column; and
        a latch mounted on the base member and constructed to releasably adjoin the mounting bracket to the vertical support column, and to be hand-operated to release the mounting bracket from the vertical support column in response to a tool-less manual manipulation of the latch;
    wherein the latch comprises:
        an abutment member repositionable to at least a latched position in which the abutment member has a free end to abut an opposing surface of the vertical support column to securely adjoin the mounting bracket to the vertical support column, and to an unlatched position to offset the abutment member from the vertical support column to release the mounting bracket; and
        at least one action mechanism connected to the base member, wherein a hand-operated manipulation of the at least one action mechanism causes the abutment member to transition from the latched position to the unlatched position;
    wherein the abutment member comprises at least one cantilevered flat spring having a stationary end securely coupled to the base member and an adjustable free end adjacent to the end plate.

2. The apparatus of claim 1, wherein the horizontal support member comprises fixed brackets for securing to a rack-mounted mount module.

3. The apparatus of claim 1, wherein the horizontal support member comprises a linear slide assembly for securing to a rack-mount module.

4. The apparatus of claim 1, further comprising a plurality of vertical support columns each having a plurality of first holes spaced along the length thereof, wherein the at least one horizontal support member is mounted between two of the columns with the pair of mounting brackets, whereby hand-operated release of the mounting brackets allow removal of the horizontal support member from the vertical support columns.

5. The apparatus of claim 4, further comprising at least a pair of the horizontal support members each connected to a pair of the mounting brackets, wherein four of the plurality of vertical support columns each has a surface for abutting an end plate of a respective one of the mounting brackets and an opposing face.

6. The apparatus of claim 4, further comprising an equipment rack in which the plurality of vertical support columns is mounted.

7. The apparatus of claim 1, wherein the mounting brackets are connected to opposing ends of a horizontal support member in a slidingly engaged manner.

8. The apparatus of claim 1, wherein the latch is constructed to self-activate to cause the abutment member to transition to the latched position in response to the installation of the mounting bracket on a vertical support column.

9. An apparatus for mounting a rack-mount module, comprising:
at least one horizontal support member configured to be secured to a side of the rack-mount module; and
a pair of mounting brackets each connected to an opposite end region of the horizontal support member to mount the horizontal support member between two vertical support columns of an equipment rack, each mounting bracket comprising:
a base member comprising a side plate securable to the horizontal support member, and an end plate integral with the side plate and comprising at least one pin extending therefrom to vertically support the horizontal support member on the vertical support column; and
a latch mounted on the base member and constructed to releasably adjoin the mounting bracket to the vertical support column, and to be hand-operated to release the mounting bracket from the vertical support column in response to a tool-less manual manipulation of the latch;
wherein the latch comprises:
an abutment member repositionable to at least a latched position in which the abutment member has a free end to abut an opposing surface of the vertical support column to securely adjoin the mounting bracket to the vertical support column, and to an unlatched position to offset the abutment member from the vertical support column to release the mounting bracket; and
at least one action mechanism connected to the base member, wherein a hand-operated manipulation of the at least one action mechanism causes the abutment member to transition from the latched position to the unlatched position;
wherein the action mechanism comprises a lever arm, rotatably connected to the base member, having an operational end adjacent to the abutment member, and a hand-operated end, wherein rotation of the hand-operated end causes the operational end to displace the abutment member into the unlatched position.

10. The apparatus of claim 9, wherein the action mechanism further comprises a second lever arm, rotatably connected to the base member, having an operational end adjacent to the abutment member, and a hand-operated end, wherein rotation of either hand-operated end causes the respective operational end to displace the abutment member into the unlatched position.

11. The apparatus of claim 9, wherein the lever arm is rotatable about one of either a horizontal axis and a vertical axis.

12. The apparatus of claim 9, wherein the mounting brackets are connected to opposing ends of a horizontal support member in a slidingly engaged manner.

13. The apparatus of claim 9, wherein the latch is constructed to self-activate to cause the abutment member to transition to the latched position in response to the installation of the mounting bracket on a vertical support column.

14. The apparatus of claim 9, wherein the horizontal support member comprises fixed brackets for securing to a rack-mounted mount module.

15. The apparatus of claim 9, wherein the horizontal support member comprises a linear slide assembly for securing to a rack-mount module.

16. The apparatus of claim 9, further comprising a plurality of vertical support columns each having a plurality of first holes spaced along the length thereof, wherein the at least one horizontal support member is mounted between two of the columns with the pair of mounting brackets, whereby hand-operated release of the mounting brackets allow removal of the horizontal support member from the vertical support columns.

17. The apparatus of claim 16, further comprising at least a pair of the horizontal support members each connected to a pair of the mounting brackets, wherein four of the plurality of vertical support columns each has a surface for abutting an end plate of a respective one of the mounting brackets and an opposing face.

18. The apparatus of claim 16, further comprising an equipment rack in which the plurality of vertical support columns is mounted.

19. An apparatus for mounting a rack-mount module, comprising:
at least one horizontal support member configured to be secured to a side of the rack-mount module; and
a pair of mounting brackets each connected to an opposite end region of the horizontal support member to mount the horizontal support member between two vertical support columns of an equipment rack, each mounting bracket comprising:
a base member comprising a side plate securable to the horizontal support member, and an end plate integral with the side plate and comprising at least one pin extending therefrom to vertically support the horizontal support member on the vertical support column, wherein the end plate further comprises a second pin extending therefrom to vertically support the horizontal support member on a vertical support column, such that the two pins of the end plate are configured to pass through a pair of holes in a vertical support column, and wherein the endplate has three or more holes arranged with different spacing, wherein the two pins of the end plate are selectively installed in only two of the three or more holes; and
a latch mounted on the base member and constructed to releasably adjoin the mounting bracket to the vertical support column, and to be hand-operated to release the mounting bracket from the vertical support column in response to a tool-less manual manipulation of the latch;
wherein the latch comprises:
an abutment member repositionable to at least a latched position in which the abutment member has a free end to abut an opposing surface of the vertical support column to securely adjoin the mounting bracket to the vertical support column, and to an unlatched position to offset the abutment member from the vertical support column to release the mounting bracket; and
at least one action mechanism connected to the base member, wherein a hand-operated manipulation of the at least one action mechanism causes the abutment member to transition from the latched position to the unlatched position.

20. The apparatus of claim 19, wherein the mounting brackets are connected to opposing ends of a horizontal support member in a slidingly engaged manner.

21. The apparatus of claim 19, wherein the latch is constructed to self-activate to cause the abutment member to transition to the latched position in response to the installation of the mounting bracket on a vertical support column.

22. The apparatus of claim 19, wherein the horizontal support member comprises fixed brackets for securing to a rack-mounted mount module.

23. The apparatus of claim 19, wherein the horizontal support member comprises a linear slide assembly for securing to a rack-mount module.

24. The apparatus of claim 19, further comprising a plurality of vertical support columns each having a plurality of first holes spaced along the length thereof, wherein the at least one horizontal support member is mounted between two of the columns with the pair of mounting brackets, whereby hand-operated release of the mounting brackets allow removal of the horizontal support member from the vertical support columns.

25. The apparatus of claim 24, further comprising at least a pair of the horizontal support members each connected to a pair of the mounting brackets wherein four of the plurality of vertical support columns each has a surface for abutting an end plate of a respective one of the mounting brackets and an opposing face.

26. The apparatus of claim 24, further comprising an equipment rack in which the plurality of vertical support columns is mounted.

27. An apparatus for mounting a rack-mount module, comprising:
- at least one horizontal support member configured to be secured to a side of the rack-mount module; and
- a pair of mounting brackets each connected to an opposite end region of the horizontal support member, each mounting bracket comprising:
  - a base member comprising a side plate securable to the horizontal support member, and an end plate integral with the side plate and comprising at least one pin extending therefrom to vertically support the horizontal support member on a vertical support column;
  - an abutment member mounted on the base member and repositionable to at least a latched position in which the abutment member has a free end to abut an opposing surface of the vertical support column to securely adjoin the mounting bracket to the vertical support column, and to an unlatched position to offset the abutment member from the vertical support column to release the mounting bracket; and
  - at least one action mechanism connected to the base member, wherein a hand-operated manipulation of the at least one action mechanism causes the abutment member to transition from the latched position to the unlatched position, wherein the action mechanism is rotatable about one of either a horizontal axis and a vertical axis.

28. The apparatus of claim 27, wherein the action mechanism comprises two lever arms, rotatably connected to the base member each having an operational end adjacent to the abutment member, and a hand-operated end, wherein rotation of either hand-operated end causes the respective operational end to displace the abutment member into the unlatched position.

* * * * *

UNITED STATES PATENT AND TRADEMARK OFFICE
CERTIFICATE OF CORRECTION

PATENT NO. : 7,694,926 B2
APPLICATION NO. : 11/776252
DATED : April 13, 2010
INVENTOR(S) : Joseph R. Allen et al.

It is certified that error appears in the above-identified patent and that said Letters Patent is hereby corrected as shown below:

In column 13, line 28, in Claim 25, delete "brackets" and insert -- brackets, --, therefor.

In column 14, line 30, in Claim 28, delete "member" and insert -- member, --, therefor.

Signed and Sealed this

Tenth Day of August, 2010

David J. Kappos
*Director of the United States Patent and Trademark Office*